US007797116B2

(12) United States Patent
Berezowski et al.

(10) Patent No.: US 7,797,116 B2
(45) Date of Patent: Sep. 14, 2010

(54) SYSTEM AND METHOD OF ACOUSTIC DETECTION AND LOCATION OF FIRE SPRINKLER WATER DISCHARGE

(75) Inventors: Andrew G. Berezowski, Wallingford, CT (US); Walter Heimerdinger, Minneapolis, MN (US); Charles R. Obranovich, Blaine, MN (US); John A. Phelps, Maple Grove, MN (US); Michael D. Shields, St. Paul, MN (US); Philip J. Zumsteg, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 357 days.

(21) Appl. No.: 11/548,878

(22) Filed: Oct. 12, 2006

(65) Prior Publication Data

US 2008/0103768 A1 May 1, 2008

(51) Int. Cl.
*G01R 13/00* (2006.01)
*G06F 11/00* (2006.01)

(52) U.S. Cl. ........................... 702/66; 702/70; 702/182; 702/188; 702/189

(58) Field of Classification Search ............. 702/50–51, 702/54–55, 66, 98, 182–190; 340/870.09, 340/286.05, 293, 381; 381/79, 82

See application file for complete search history.

(56) References Cited

U.S. PATENT DOCUMENTS

2005/0183773 A1* 8/2005 Sinclaire ..................... 137/357
2005/0273279 A1* 12/2005 Faltesek ...................... 702/51

OTHER PUBLICATIONS

Tolonen, T; "A Computationally Efficient Multipitch Analysis Model:" IEEE Transactions on Speech and Audio Processing, vol. 8, No. 6, Nov. 2000, pp. 708-716.

International Search Report and Written Opinion of the International Searching Authority, mailed Mar. 18, 2008 corresponding to International application No. PCT/US07/80272.

* cited by examiner

*Primary Examiner*—Hal D Wachsman
*Assistant Examiner*—Phuong Huynh
(74) *Attorney, Agent, or Firm*—Husch Blackwell Sanders Welsh & Katz

(57) ABSTRACT

A system and method to detect acoustic signals from fire sprinkler heads discharging water and to locate such devices in a public building, airport, sports stadium or other structure which can include a system to measure speech intelligibility. Time and frequency domain analysis are carried out to establish the presence of signals characteristic of water discharge from a fire sprinkler.

6 Claims, 6 Drawing Sheets

DETECT = (Ax < LAG) AND (Ay > Cy > By ) AND (Ay > My * Cy) AND (Cx > Mx * Ax) AND (Cx > Bx)

WHERE: (A) LAG, Mx AND My ARE RATIOMETRIC CONSTANTS

DETECT = (Ax < LAG) AND (Ay > Cy > By ) AND (Ay > My * Cy) AND (Cx > Mx * Ax) AND (Cx > Bx)

WHERE: (A) LAG, Mx AND My ARE RATIOMETRIC CONSTANTS

SYSTEM AND METHOD OF ACOUSTIC DETECTION AND LOCATION OF FIRE SPRINKLER WATER DISCHARGE

FIELD OF THE INVENTION

The invention pertains to systems and methods of audibly detecting water discharge from fire sprinklers. More particularly, systems and methods in accordance with the invention distinguish such audio signals from other sounds, and identify the location of the respective audio signal in a particular region such as public buildings, airports, sports stadiums and the like.

BACKGROUND OF THE INVENTION

The discharge of water from a fire sprinkler is of concern to both building managers and fire service personnel. During normal operation of a building equipped with a fire sprinkler system, there should be no discharge of water from any fire sprinkler head. However, the failure rate of fire sprinkler heads, or physical damage to fire sprinkler heads, may result in the unintended discharge of water. Such water discharge may result in property damage, business loss and increased insurance costs for the building.

When a fire emergency occurs in a building equipped with a fire sprinkler system, the operation of the system is intended to cause a discharge of water in response to the ambient temperature near a fire sprinkler head exceeding a preset limit. In this situation, the fire sprinkler head is operating normally, and the precise location of any fire sprinkler heads discharging water is of interest to the fire incident commander, and any firefighters responding to the alarm. In some buildings, the design of the fire sprinkler system risers and feeder pipes includes a water flow sensor. Such a sensor may indicate which riser or feeder pipe has water flow, indicating one or more fire sprinkler heads are discharging water. However, the physical location of the water discharge is only known to a coarse resolution, as indicated by the water flow sensors.

Since the location of the fire within a building or structure is vitally important for planning firefighter response, information about the location of the discharging fire sprinkler heads would be an asset during a fire emergency.

For both the purposes of the building manager and the first responder team, any system reporting the location of a fire sprinkler water discharge must be very reliable. Since building management needs to manually shutoff the water, and direct the response of personnel, improper location information may lead to costly action in the wrong location. Similarly, the fire incident commander needs to minimize risk to firefighters while effectively managing the fire response, both of which require accurate location information about fire sprinkler head water discharge.

Finally, the detection mechanism must function properly over a range of acoustic environments. Since the most likely place for a water sprinkler discharge is also very noisy (i.e. flame front), a robust and accurate means of detection is required. However, a non-emergency situation may also include acoustic sources mimicking a fire sprinkler discharge, such as open water faucets, showers, waterfalls, fountains, and other architectural water features.

There continues to be a need for systems and methods which can automatically determine the existence and location of audible signals resulting from the discharge of water from fire sprinklers. Preferably such systems and methods could be integrated with new and into existing building or regional monitoring systems without requiring extensive redesign or additional hardware. It would also be desirable to be able to provide audible and/or visual indicators at monitoring system control panels so that those directing the response to the emergency will immediately be informed that one or more monitored fire sprinklers are discharging water.

DETAILED DESCRIPTION OF THE EMBODIMENTS

Figure 1:
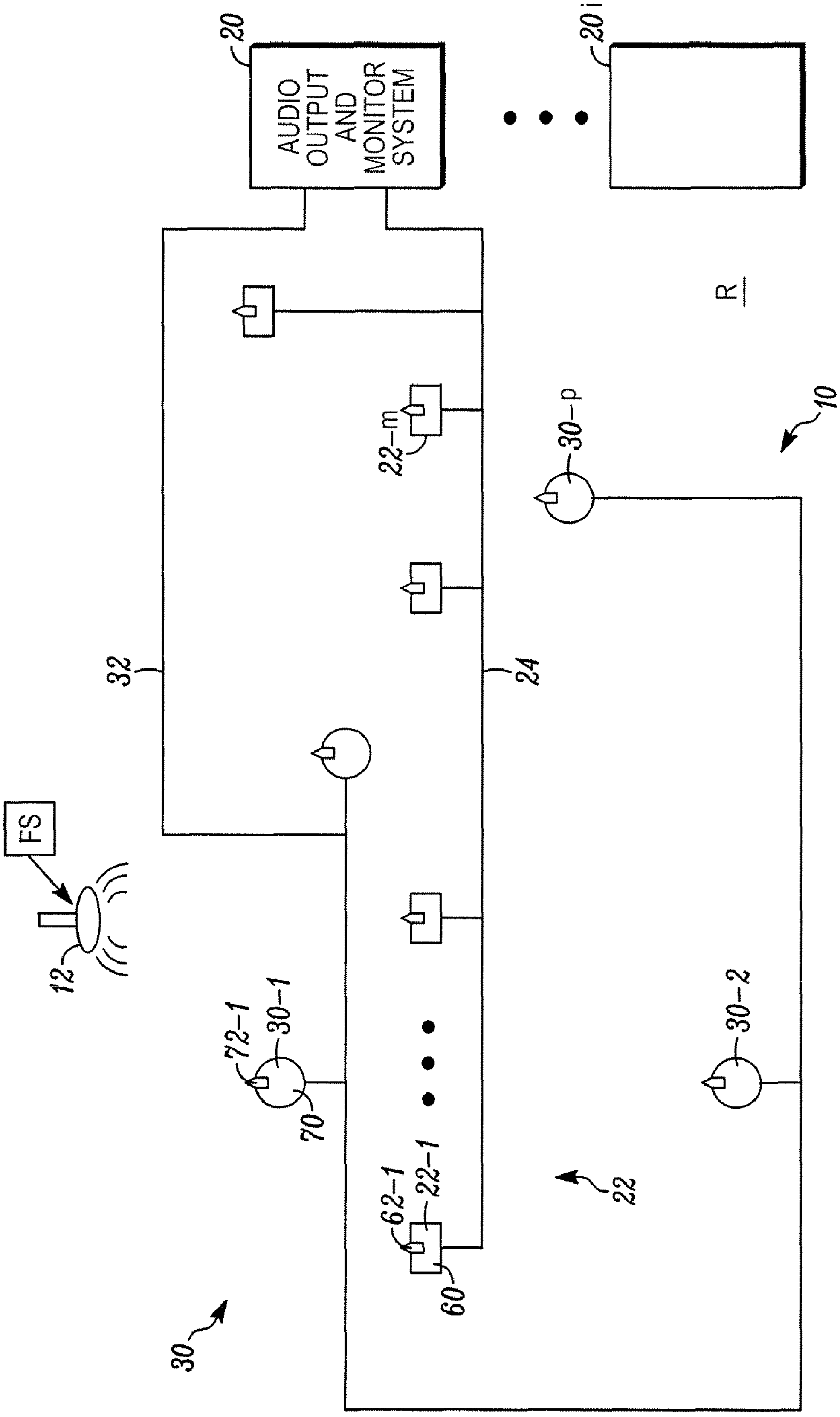
FIG. 1 is a block diagram of a system in accordance with the invention.

While embodiments of this invention can take many different forms, specific embodiments thereof are shown in the drawings and will be described herein in detail with the understanding that the present disclosure is to be considered as an exemplification of the principles of the invention and is not intended to limit the invention to the specific embodiment illustrated.

The sound of the water discharged from the sprinkler head may be used to detect and locate a site of sprinkler water discharge. Currently, only a coarse resolution of the location of sprinkler water discharge in a structure is available from flow sensors in risers feeding the sprinkler head network. A fire incident commander may utilize sprinkler discharge information based on this invention to appropriately deploy first responders. Also, this invention may be used to detect non-alarm water sprinkler head discharge, enabling manual intervention to shutoff the flow of water and minimize structure and/or property damage/loss.

In many facilities, such as public buildings, airports, sports stadiums and the like, a system which is present to measure speech intelligibility from audio announcement systems may also incorporate capabilities in accordance with the present invention, to detect and locate fire sprinkler heads discharging water. Representative systems include those disclosed in U.S. patent application Ser. No. 10/740,200 (the '200 application) filed Dec. 18, 2003 and entitled Intelligibility Testing for Monitoring of Public Address Systems as well as U.S. patent application Ser. No. 11/064,414 (the '414 application) filed Feb. 23, 2005 and entitled, Methods and Systems for Intelligibility Measurement of Audio Announcement Systems. The noted patent applications are assigned to the assignee hereof and incorporated by reference. Such considerations apply to audio announcement systems in general as well as those which are associated with fire safety, building or regional monitoring systems.

Systems and methods in accordance with the invention sense and evaluate audio signals from one or more sources, such as fire sprinkler heads discharging water, to detect certain acoustic properties of fire sprinkler heads being monitored. The results of the analysis can be used to distinguish water discharge audio signals from other acoustic elements in the region, thereby providing indicators of the presence of a fire sprinkler water discharge as well as location of the sprinkler head discharging water.

Analysis of audio signal data collected from fifteen different fire sprinkler heads, manufactured between 1986 and 2002 in accordance with NFPA 13 Standard for the Installation of Sprinkler Systems 2002 Edition or NFPA 13D: Standard for the Installation of Sprinkler Systems in One- and Two-Family Dwellings and Manufactured Homes, resulted in the identification of a common signal characteristic unique to the tested sprinkler devices. All of the tested products operate within the 7 PSI-90 PSI water pressure range specified, leading to the common signal characteristic which can be used to detect water discharge from fire sprinkler heads.

Exemplary devices tested include:

| | | | | |
|---|---|---|---|---|
| Victor | SSP | ½" | V2707 | (2001) |
| Grinnell | SSP | ½" | — | (2000) |
| Star | SSP | ½" | S2971 | (2002) |
| Star/Senju | SSP | ½" | 177R | (1997) |
| Viking | SSP | ½" | 589A | (1991) |
| Rasco | SSP | ½" | R1715 | (2002) |
| Astra | SSP | ½" | 635P | (1990) |
| Firematic | SSP | ½" | Model A | (not available) |
| Rasco | SSP | ½" | Model G | (2002) |
| Star | SSP | 7/16" | 5R | (1995) |
| Rasco | SSP | 7/16" | Model G | (2000) |
| Grinnell | SSP | ½" | F976 | (1998) |
| Reliable | Pend | ½" | F4FR | (2002) |
| Firematic | SSP | ½" | Model S | (1986) |

Since audio signals from 100% of the tested units have been-accurately detected, due to the common audio signal characteristics, it is expected that audio signals emitted by most fire sprinkler heads discharging water can be expected to be detectable. In an aspect of the invention, time-domain and frequency-domain signal analysis can be used to detect water discharge from a fire sprinkler head.

FIG. 1 illustrates a regional monitoring system 10 which embodies the present invention. At least portions of the system 10 are located within a region R. Speech intelligibility can but need not be evaluated. It will be understood that the region R could be a portion of or the entirety of a floor of a building. The type of building and/or size of the region or space R are not limitations of the present invention.

A fire sprinkler head FS is illustrated in region R. Fire sprinkler head FS is one of fire sprinkler devices 12. Neither the exact type of device 12 nor the way in which the fire sprinkler FS is mounted are limitations of the invention. If fire sprinkler head FS discharges water, the device 12 will emit acoustic signals, as discussed above.

The system 10 includes one or more monitoring system control unit(s) 20. It will be understood that the control unit(s) 20 could be part of or incorporate a regional control and monitoring system which might include a fire detection system, a security system, and/or a building control system, all without limitation. It will be understood that the details of the unit(s) 20 are not limitations of the present invention. It will also be understood that such unit(s) 20 could communicate with one another, or with added processors, via one or more computer networks.

System 10 can incorporate a plurality of audio sensing modules having members 22-1 . . . 22-*m*. The audio sensing modules or units 22-1 . . . -*m* can also be in bi-directional communication via a wired or wireless medium 24 with the unit 20.

As described above and in more detail subsequently, the audio sensing modules 22-*i* respond to incoming audio from one or more fire sprinkler devices such as the unit 12 and carry out, at least in part, processing thereof. Those of skill will understand that the below described processing could be completely carried out in some or all of the modules 22-*i*. Alternately, the modules 22-*i* can carry out initial portion of the processing and forward information, via medium 24 to one or more units 20, or one or more other modules 22-*i* and 30-*p*, for further processing.

The system 10 can also incorporate a plurality of ambient condition detectors 30 capable of detecting acoustic signals. The members of the plurality 30, such as 30-1, -2 . . . -*p* could be in bidirectional communication via a wired or wireless medium 32 with the unit 20. It will be understood that the members of the plurality 22 and the members of the plurality 30 could communicate on a common medium all without limitation.

The ambient condition detectors 30-*p* respond to incoming audio from one or more fire sprinkler devices such as the unit 12 and carry out, at least in part, processing thereof. Those of skill will understand that the below described processing could be completely carried out in some or all of the modules 30-*p*. Alternately, the modules 30-*p* can carry out initial portion of the processing and forward information, via medium 24 to the unit 20, or one or more other modules 22-*i* and 30-*p*, for further processing. As taught in both the '200 and '414 applications, the locations of a plurality of audio sensing modules within the monitored facility are known to the system 10. Hence, the location of each such module 22-*i* or 30-*p* responding to incoming audio also indicates the location of the sensed audio within the facility.

Figure 2A:
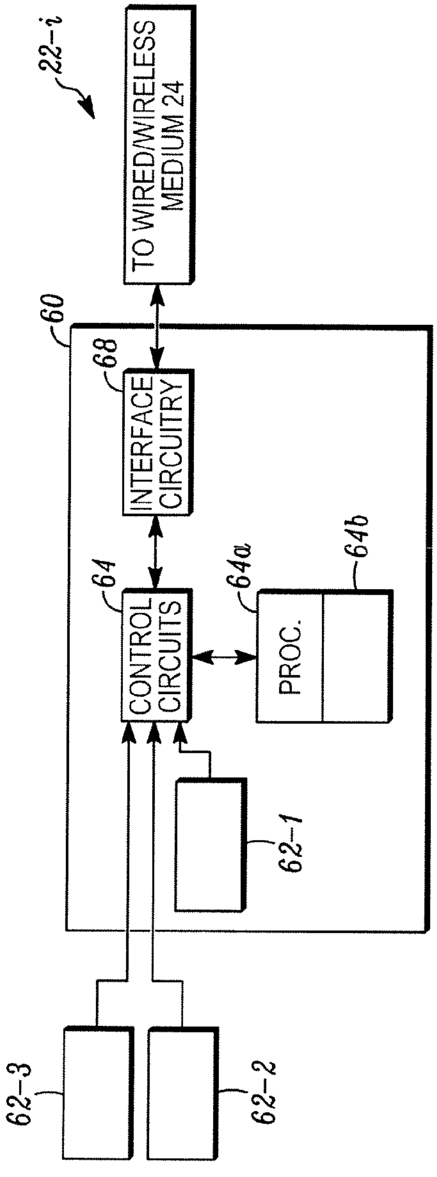
FIG. 2A is a block diagram of an audio sensing module in accordance with the present invention.

FIG. 2A is a block diagram of a representative member 22-*i* of the plurality of audio sensing modules 22. Each of the members of the plurality, such as 22-*i*, includes a housing 60 which carries at least one audio input transducer 62-1 which could be implemented as a microphone. Additional outboard, audio input transducers 62-2 and 62-3 could be coupled along with the transducer 62-1 to control circuitry 64. The number of such transducers is not a limitation of the invention.

The control circuitry 64 could include a programmable processor 64*a* and associated control software 64*b*, as discussed below, to implement audio data acquisition processes as well as analysis processes to determine if incoming sensed audio, being received at the transducers 62-1, -2 and -3, has been emitted by water discharge from a fire sprinkler head, such as device 12. The processor has first, second, third and fourth software and has a first and second predetermined audio threshold. The first software establishes a first plurality of time based records of the incoming sensed audio. The second software selects from the first plurality of time based records those that exceed the first predetermined audio threshold to form a second plurality of time based records. The third software selects from the second plurality of time based records those that do not exceed the second predetermined threshold to form a third plurality of time based records. The fourth software analyzes the time based records of the third plurality and determines which have been emitted by which of the fire sprinklers devices 12 by determining which members of the third plurality exhibit at least first, second and third temporally spaced amplitude parameters with the first and third amplitude parameters being larger than the second parameter. To set the above the module 22-*i* can communicate via interface circuitry 68 to the wired or wireless medium 24.

Figure 2B:
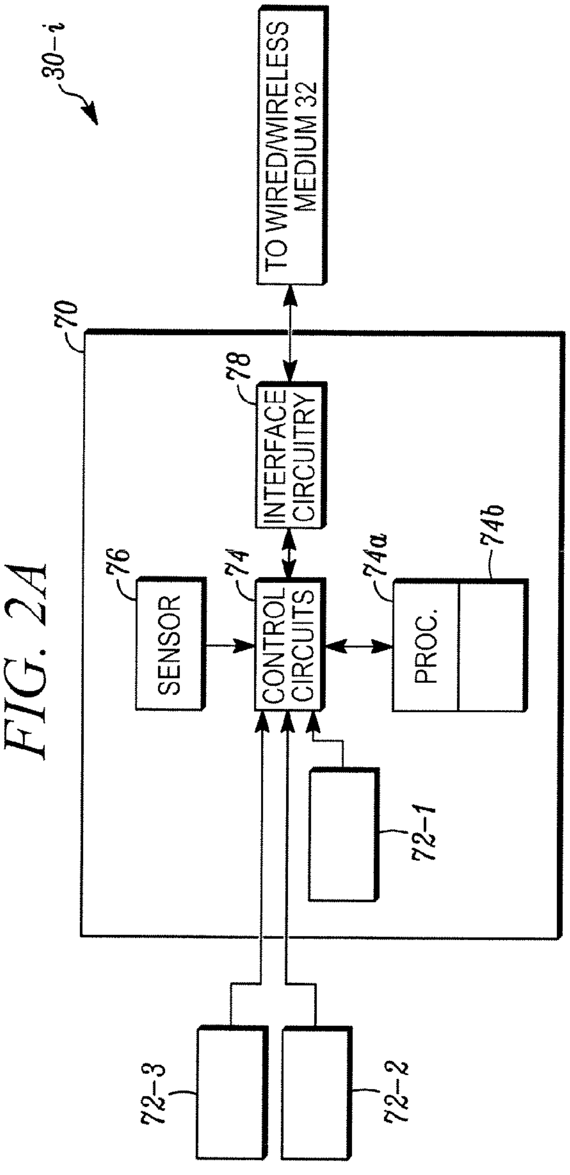
FIG. 2B is a block diagram of an ambient condition detector which incorporates audio sensing in accordance with the present invention.

FIG. 2B is a block diagram of a representative member 30-*i* of the plurality 30. The member 30-*i* has a housing 70 which can carry an onboard audio input transducer 72-1 which could be implemented as a microphone. Additional audio input transducers 72-2 and 72-3 displaced from the housing 70 can be coupled, along with transducer 72-1 to control circuitry 74. The number of such transducers is not a limitation of the invention.

Control circuitry 74 could be implemented with and include a programmable processor 74*a* and associated control software 74*b*. The detector 30-*i* also incorporates at least one ambient condition sensor 76 which could sense smoke, flame, temperature, gas all without limitation. Multiple sensors could be included in detector 30 without limitation. Multiple sensors could be included in detector 30. The detector 30-*i* is in bidirectional communication with interface circuitry 78 which in turn communicates via wired or wireless medium 32 with monitoring system 20.

As discussed subsequently, processor 74*a* in combination with associated control software can not only process signals from sensor 76 relative to the respective ambient condition(s) but also audio related signals from one or more transducers 72-1, -2 or -3 all without limitation. Processing, as described subsequently, can carry out evaluation and a determination as to the nature and quality of audio being received and whether that audio is being emitted by a fire sprinkler head discharging water, such as the device 12.

Figure 3:
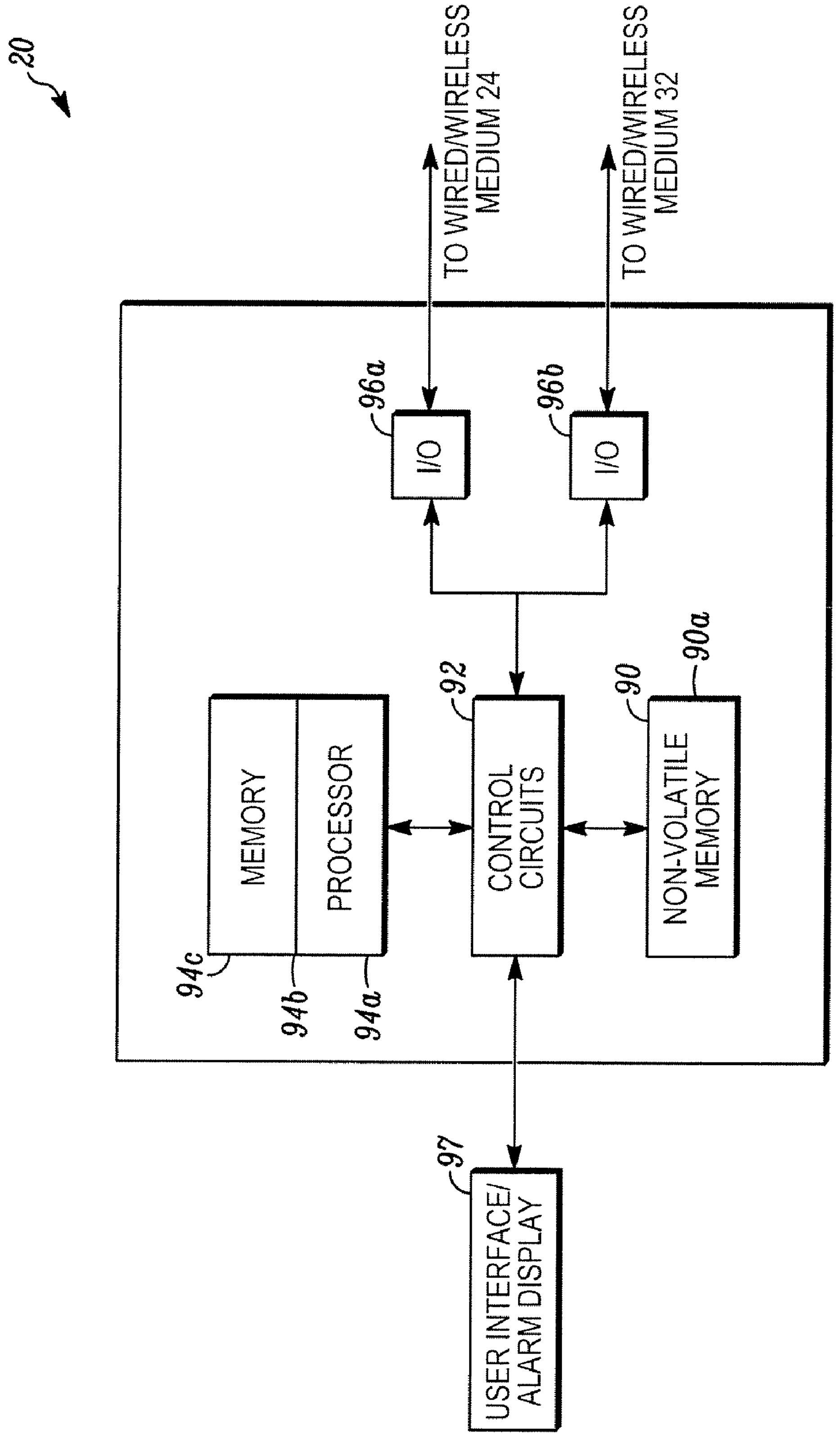
FIG. 3 is a block diagram of a monitoring system control unit.

FIG. 3 is a block diagram of an exemplary representation of the monitoring control unit 20. Unit 20 can incorporate a non-volatile memory or storage unit 90 for purposes of storing control software 90*a*. The unit 20 can also incorporate control circuits 92 coupled to the storage unit 90 and software 90*a*. The control circuits 92 can incorporate a programmable processor 94*a* as well as additional storage 94*b* of a type that would be understood by those of skill in the art which could include read/write memory of a volatile or non-volatile form. Software 90*a*, 94*c* which would be of a type understood by those of skill in the art in responding to audible detection units, such as 22-*i*, to carry out detection of water discharge from fire sprinklers, or, to respond to the detectors, such as the detector 30-*p*, can be executed by control circuits 92 and/or processor 94*a*.

Unit 20 can incorporate input/output interfaces to wired and wireless mediums 24, 32, namely circuits 96*a*, 96*b*. In addition, unit 20 can incorporate a user interface and alarm display device 97. It will be understood that the unit 20 illustrated in FIG. 3 is exemplary only and is not a limitation of the present invention.

Figure 4:
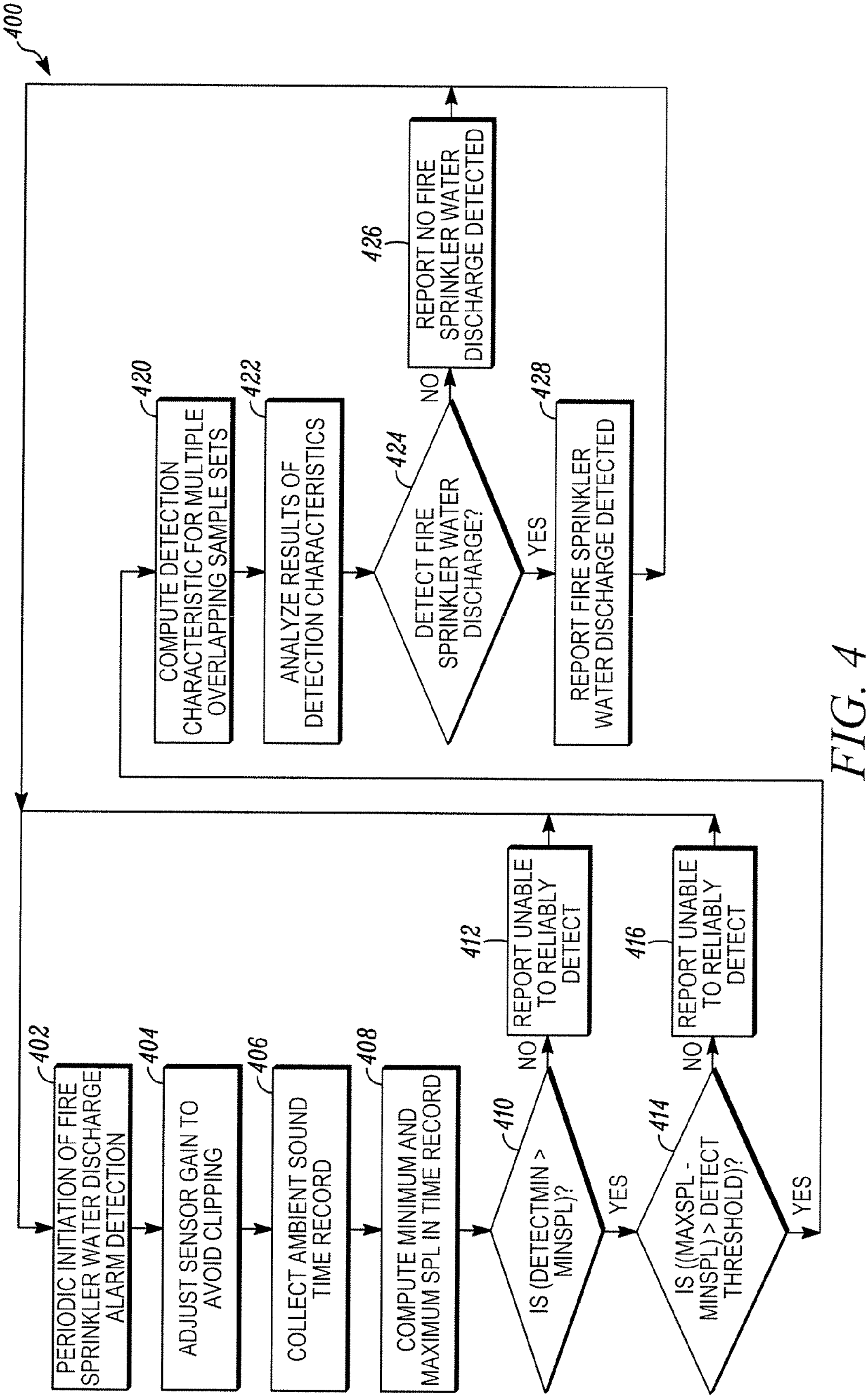
FIG. 4 is a flow diagram illustrating exemplary signal processing in accordance with the invention.

Process 400, see FIG. 4, to establish the presence of one or more water discharging fire sprinkler devices, such as the device 12 in the region R can be executed wholly or in part at audible detection units 22-*i*, detectors 30-*p* and/or control unit 20. Process 400 can include a periodic initiation thereof, step 402.

In a step 404 the gain of the respective sensor can be adjusted to avoid clipping or distortion. In a step 406 one or more ambient sound time records can be collected. It will be understood that if a plurality of such records are being collected that the subject processing will take place relative to at least selected records.

In a step 408 minimal and maximum sound pressure levels are established for each of the time records. In a step 410 if the minimum sound pressure level is below a predetermined threshold then a determination is made that it is not possible to reliably determine if a fire sprinkler head device discharging water is emitting the sensed audible signal based on the subject record(s).

A report is generated in a step 412 indicating the sound pressure level is too low for reliable detection of a fire sprinkler head device discharging water.

If the minimum sound pressure level exceeds a predetermined first threshold, a determination is made as to whether or not the difference between a maximum sound pressure level and a minimum sound pressure level exceeds a detection threshold, step 414.

A report is generated in a step 416 indicating the sound pressure level difference is too low for reliable detection of a fire sprinkler head device discharging water.

The results of the detection step 414 are accumulated for multiple overlapping acoustic sample sets, step 420.

An analysis is made step 422 as to whether the characteristics of water discharge from a fire sprinkler head are present in one or more of the sample sets.

If so, in a step 424 a determination is made as to whether a fire sprinkler device water discharge acoustic signal has been detected, and if so, in a step 428 a report is generated, which could cause unit 20 to present an audible or visible indicator at user interface 97 indicating that a fire sprinkler head discharging water has been detected and location information can be provided therewith.

If the step 424 determines the sample sets do not contain characteristics of water discharge from a fire sprinkler head, a report is generated in step 426 indicating no water discharge from a fire sprinkler head device 12 has been detected.

It will be understood that the processing 400 of FIG. 4 is illustrative only. Variations thereof come within the spirit and scope of the present invention. Further, those of skill will understand that fire sprinkler heads discharging water can be recognized as described above need not conform literally to any predetermined standard.

Figure 5A:
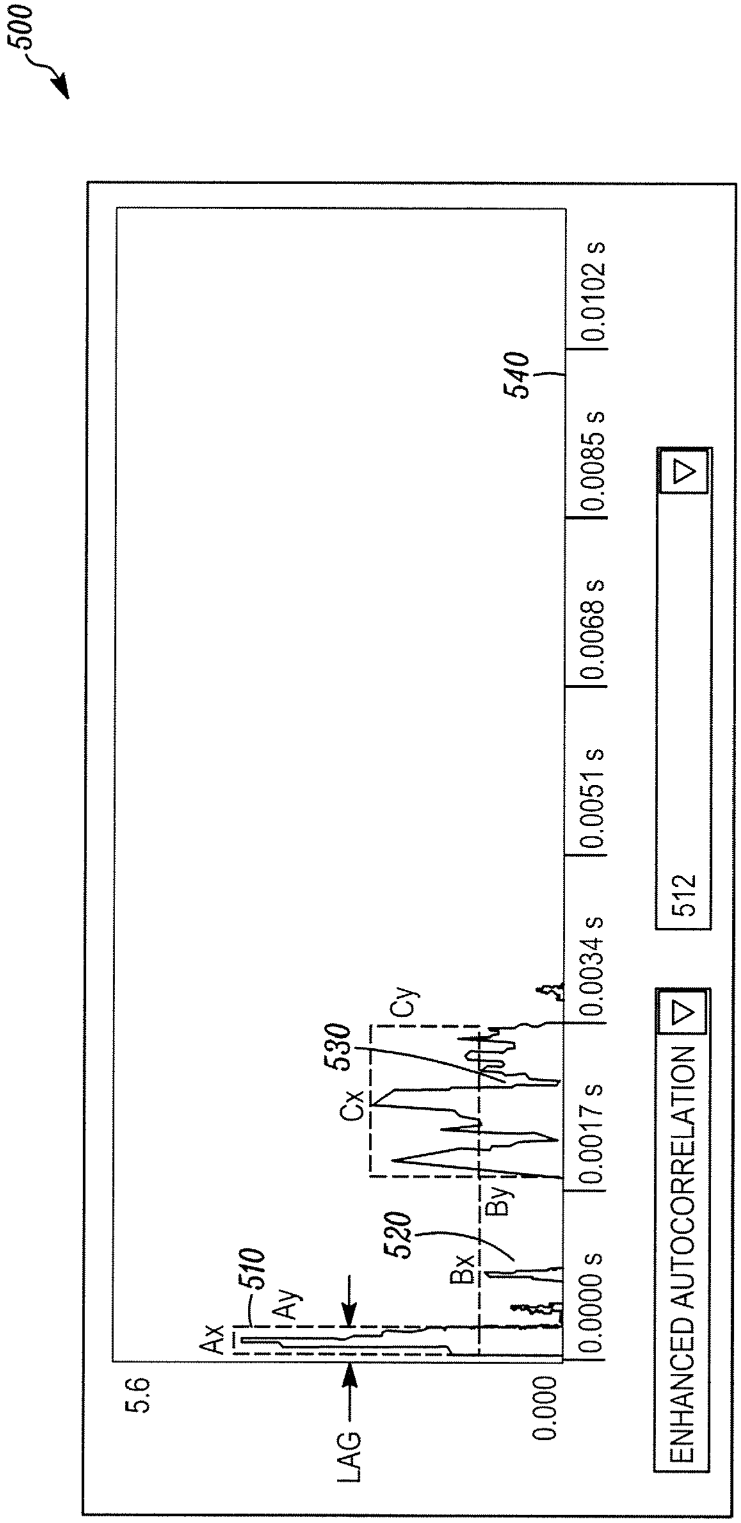
FIG. 5A is a graph illustrating characteristics of a fire sprinkler water discharge acoustic signal for 512 ambient sound samples.

FIG. 5A illustrates characteristics 500 typical of the detected signal (analyzed in FIG. 4, at 422). In a preferred embodiment, each ambient sound time record(s) containing 512 samples is processed with an enhanced summary autocorrelation function (ESACF) which may produce one or more output values as in 510, 520 and 530 in multiple output bins 540. Parameters of at least three groups of output bin values 510, 520, 530 can be processed as in FIG. 5A to detect a fire sprinkler discharge (FIG. 4, at 424). If that discharge is indicated in the affirmative, subsequent processing occurs (FIG. 4, at 428).

The detect processing, carried out in FIG. 4 at 422, is as follows:

$$\text{Detect} = (Ax < Lag) \text{ AND } (Ay > Cy > By) \text{ AND } (Ay > My * Cy) \text{ AND } (Cx > Mx * Ax) \text{ AND } (Cx > Bx)$$

wherein Ay is the first peak amplitude value, By is the second peak amplitude value, Cy is the third peak amplitude value, Ax is the duration perimeter of the first peak amplitude value, Bx is the duration perimeter of the second peak amplitude value and Cx is the duration perimeter of the third peak amplitude value. As noted in the above, the fourth software determines which sprinklers of the third plurality have a duration parameter Ax which is less than the predetermined value and determines if Cx (the duration perimeter of the third peak amplitude value) exceeds (>) Bx (the duration perimeter of the second peak amplitude value) and where the Cx (the duration perimeter of the third peak amplitude value) is less (<) than a predetermined value.

Figure 5B:
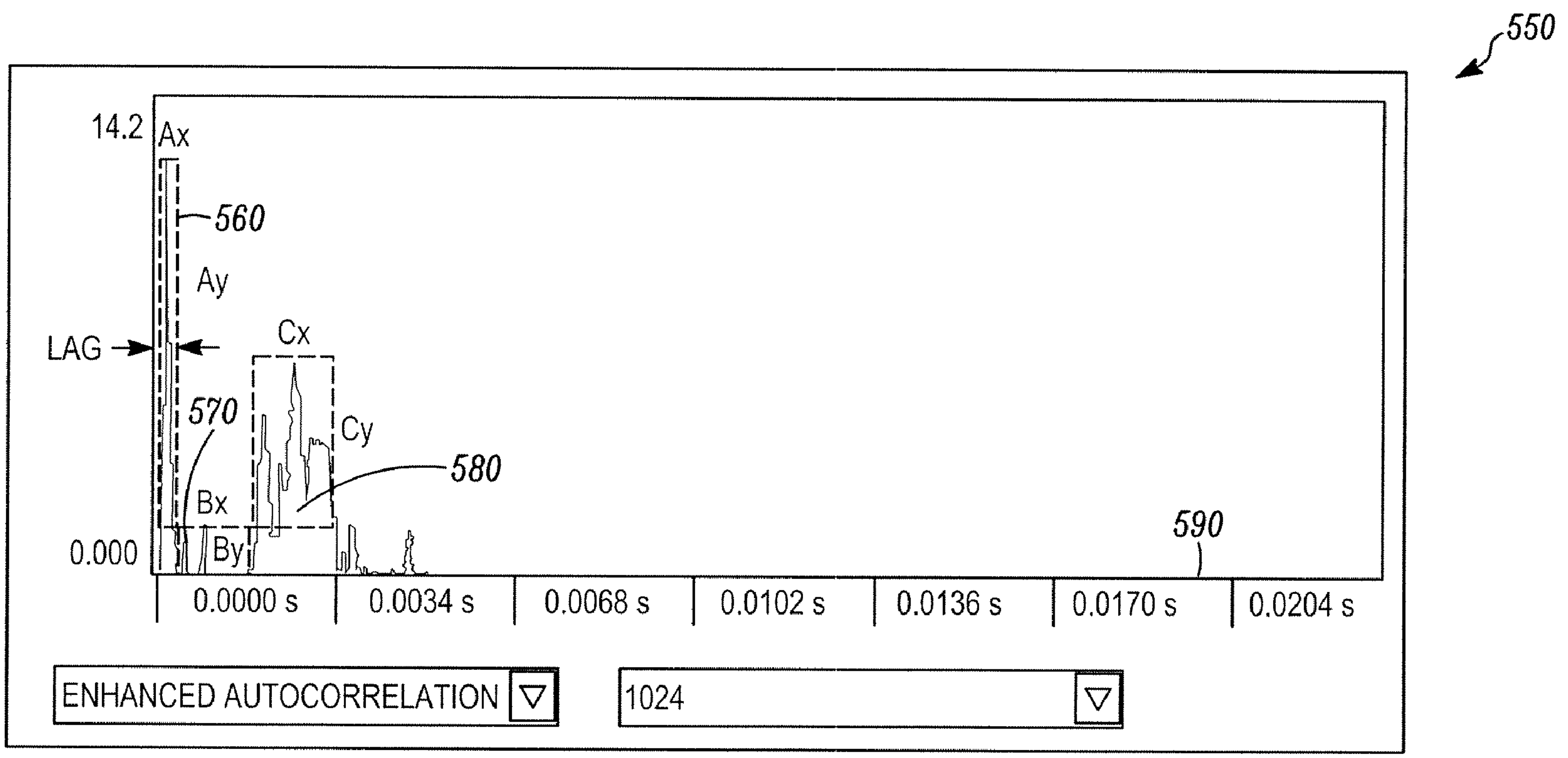
FIG. 5B is a graph as in FIG. 5A for 1024 ambient sound samples.

FIG. 5B illustrates results of the auto-correlation processing (FIG. 4 at 422) with time record(s) containing 1024 samples. The same processing, described above, can be used. Lag, Mx and My are ratiometric constants as would be understood by those of skill in the art and could be determined experimentally.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

The invention claimed is:

1. An audible system to detect and locate water discharge from a fire sprinkler comprising:

a plurality of fire sprinklers mounted in a building, a plurality of said fire sprinklers each having an audio sensing module connected thereto, programmable processor connected to each audio sensing module;

said processor providing a first plurality of time based records of audio received by a first plurality of said audio sensing modules;

said processor selecting audio sensing modules from the first plurality of audio sensing modules that exceed a predetermined threshold thereby said processor providing a second plurality of audio sensing modules;

said processor selecting audio sensing modules from the second plurality of audio sensing modules that exceed a second predetermined threshold thereby said processor providing a third plurality of audio sensing modules; and said processor selecting audio sensing modules from the third plurality of audio sensing modules by determining which members of the third plurality of audio sensing modules exhibit at least first, second and third temporally spaced amplitude parameters with the first and third amplitude parameters being larger than the second parameter.

2. A system as in claim 1 wherein said processor provides an identifier of each determined member of the third plurality of audio sensing modules and the location thereof to a displaced site.

3. A system as in claim 1 wherein said processor provides also determines which members of the third plurality of audio modules have a duration parameter, associated with a respective first amplitude parameter, which is less than a predetermined value.

4. A system as in claim 3 wherein said processor provides also determines if a duration parameter associated with the third amplitude parameter exceeds a duration parameter associated with the second amplitude parameter.

5. An audible method to detect and locate water discharge from one of a group of fire sprinklers each connected to an audio sensing module comprising:

establishing using a processor a first and second threshold from a first plurality of ambient time based records of said audio sensing modules;

determining using the processor if any of the audio sensing modules exceeds a third predetermined threshold; and determining using the processor water discharge by selecting those members exceeding the third predetermined threshold and where the record exhibits at least first, second and third temporally spaced sound peak amplitude values with the first and third peak amplitude values being larger than the second peak amplitude value, and where a duration parameter associated with the third peak amplitude value is greater than a duration parameter of the second peak amplitude value.

6. A method as in claim 5 where a duration parameter, associated with the first peak amplitude value is less than a predetermined value.

* * * * *